United States Patent
Boemler

(10) Patent No.: US 10,084,468 B1
(45) Date of Patent: Sep. 25, 2018

(54) LOW POWER ANALOG-TO-DIGITAL CONVERTER

(71) Applicant: Raytheon Company, Waltham, MA (US)

(72) Inventor: Christian M. Boemler, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/466,417

(22) Filed: Mar. 22, 2017

(51) Int. Cl.
*H03M 1/06* (2006.01)
*H03M 1/38* (2006.01)
*H03M 7/16* (2006.01)

(52) U.S. Cl.
CPC .............. *H03M 1/38* (2013.01); *H03M 7/16* (2013.01)

(58) Field of Classification Search
CPC .................................. H03M 1/38; H03M 7/16
USPC ........ 341/155, 166, 169, 170, 157; 375/376, 375/238
See application file for complete search history.

(56) References Cited

U.S. PATENT DOCUMENTS

| | | | | |
|---|---|---|---|---|
| 5,200,623 A * | 4/1993 | Cannata | ................. | H04N 5/235 250/332 |
| 6,078,193 A * | 6/2000 | Bazuin | ..................... | G06F 1/04 326/93 |
| 8,633,845 B2 | 1/2014 | Standley | | |
| 8,803,725 B2 | 8/2014 | Osaki et al. | | |
| 2005/0190096 A1 | 9/2005 | Isomura | | |
| 2007/0108845 A1* | 5/2007 | Crane | .................... | H01H 9/542 307/116 |
| 2013/0154705 A1* | 6/2013 | Sakurai | .................... | H03K 3/86 327/179 |
| 2013/0235240 A1* | 9/2013 | Yoshida | ................. | H04N 5/378 348/302 |

FOREIGN PATENT DOCUMENTS

| EP | 1460763 A1 | 9/2004 |
|---|---|---|
| JP | S5683127 A | 7/1981 |

OTHER PUBLICATIONS

Notification of Transmittal of the International Search Report of the International Searching Authority, or the Declaration; PCT/US2018/023537; dated Jul. 3, 2018, 5 pages.
Notification of Transmittal of the Written Opinion of the International Searching Authority, or the Declaration; PCT/US2018/023537; dated Jul. 3, 2018, 9 pages.

* cited by examiner

*Primary Examiner* — Peguy Jean Pierre
(74) *Attorney, Agent, or Firm* — Cantor Colburn LLP

(57) ABSTRACT

A single slope analog to digital converter includes a comparator having a positive input and a negative input and a comparator output, a counter and a latch connected to an output of the counter and that includes a trigger input. Also included is a pulse generator coupled to the comparator output that produces a pulse of a defined width each time a signal on the negative input transitions from a voltage level that is below a voltage level on the positive input to a voltage level that is above the voltage level on the positive input.

16 Claims, 6 Drawing Sheets

LOW POWER ANALOG-TO-DIGITAL CONVERTER

BACKGROUND

The present disclosure relates to an analog-to-digital converter (ADC) and, in particular to a low power ADC.

Over the last few years, electro-optical sensors have been developed that incorporate increasingly higher resolution. Such detectors may have different operations modes or settings that need to be stored or altered.

In particular, such sensors may include a read-out integrated circuit (ROIC) that reads out the information received by an array of pixels.

Many ROICs may be used for infrared imaging and require cooling to cryogenic temperatures to improve image quality. Power dissipation on ROICs is extremely critical for these applications since current coolers have low efficiency and the entire assembly may be mobile (e.g. vehicle, airborne or space craft) where system power is limited.

Traditionally, many ROICs utilize single-slope (SS) or double-slope (DS) analog-to-digital converters.

Conventional SS-ADC designs use a comparator output that directly latches a graycode counter value into a latch (e.g., memory). One input to the comparator is a voltage ramp that begins at a stating value and then increases over time. The greycode counter begins counting and counts up as the voltage increases. The other input to the comparator is the analog value that needs to be converted to a digital value. When the ramp input has crossed (i.e., becomes greater than) the analog value, the comparator changes the graycode counter values. This change in value is directly coupled to a latch and is used to cause the greycode counter value to be stored into the latch. Such circuits generally work for their intended purposes but as discussed more fully below, such circuits may have drawbacks when used in low power environments.

SUMMARY

According to one embodiment, single slope analog to digital converter (ADC) is disclosed. The single slope ADC of this embodiment includes a comparator having a positive input and a negative input and a comparator output, a counter and a latch connected to an output of the counter and that includes a trigger input. The single slope ADC also includes a pulse generator coupled to the comparator output that produces a pulse of a defined width each time a signal on the negative input transitions from a voltage level that is below a voltage level on the positive input to a voltage level that is above the voltage level on the positive input.

According to another embodiment, a single slope analog to digital converter (ADC) that includes a first comparator having a positive input and a negative input and a first comparator output, a first counter, a first latch connected to an output of the first counter and that includes a first trigger input and a first pulse generator coupled to the first comparator output that produces a pulse of a defined width each time a signal on the negative input of the first comparator transitions from a voltage level that is below a voltage level on the positive input of the first comparator to a voltage level that is above the voltage level on the positive input of the first comparator is disclosed. The single slope ADC also includes a second comparator having a positive and a negative input and a second comparator output, a second counter, a second latch connected to an output of the second counter and that includes a second trigger input and a second pulse generator coupled to the second comparator output that produces a pulse of a defined width each time a signal on the negative input of the second comparator transitions from a voltage level that is below a voltage level on the positive input of the second comparator to a voltage level that is above the voltage level on the positive input of the second comparator.

According to another embodiment, an image detector is disclosed. The image detector includes an array of detector unit cells including a first unit cell that includes a first unit cell output and a single slope analog to digital converter (ADC) coupled to the output first unit cell output. The ADC can be the ADC of either of the two previously described embodiments.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be discussed below, a ROIC (or other circuit) may include one or more SS-ADCs therein. In some cases, such as aerospace or outer space applications, power usage needs to be minimized and prior art SS-ADCs may use more than desired in such applications.

Figure 1:
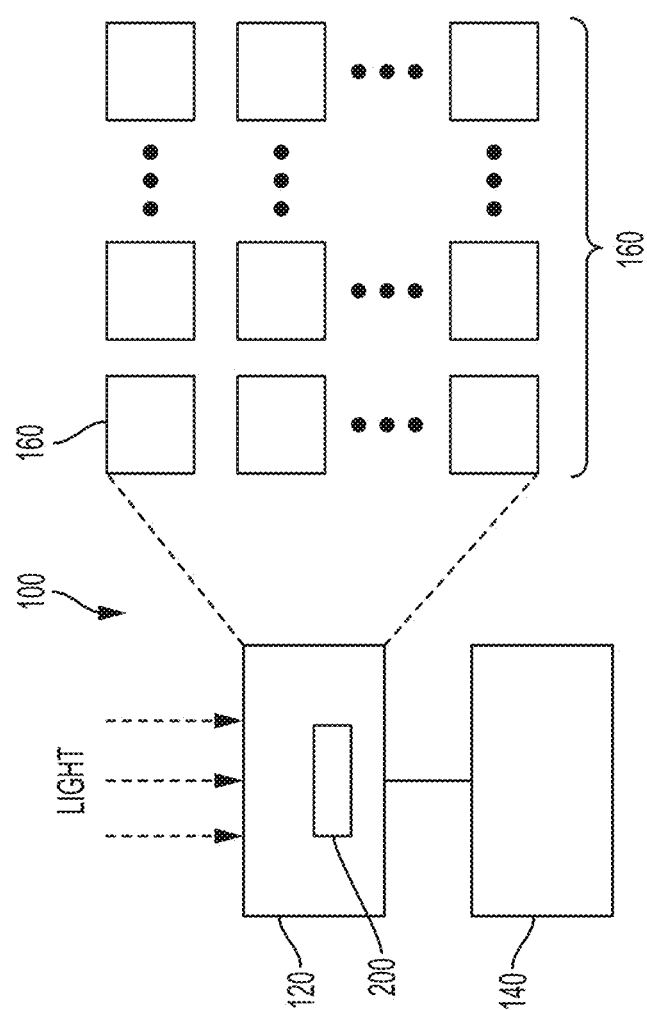
FIG. 1 is a schematic diagram illustrating an image detector in accordance with embodiments.

FIG. 1 is a schematic diagram illustrating an image detector 100 in accordance with embodiments. Such a detector 100 may be deployed, for example, on a satellite or other airborne apparatus such as an aircraft. Image detector 100 may be a focal plane array (FPA), active pixel sensor (APS) or any other suitable energy wavelength sensing device. The image detector 100 may be used as a component of a photographic and/or image capturing device, such as a digital camera, video camera or other similar device. The image detector 100 may include detection device 120 and ROIC 140.

The detection device 120 includes an array of photosensitive/energy wavelength sensitive detector unit cells 160 arranged in an X×Y matrix. Each of the detector unit cells 160 may accumulate charge or produce a current and/or voltage in response to light incident upon the detector unit cell 160 and may correspond to a pixel in a captured electronic image. One or more of the detector unit cells 160 may include a photovoltaic detector (e.g., a photovoltaic single absorber detector or a photovoltaic multi-absorber (multi-junction) detector), a barrier device detector, a position sensitive detector (PSD) or other suitable detector. The detector unit cells 160 may include any suitable materials, dopant concentrations, number of layers, layer thicknesses and/or other characteristics selected based on the type of photodetector.

The ROIC 140 may be used for processing of the incident light (e.g., to create an image representative of the incident light). For example, the ROIC 140 interfaces with detection device 120 to receive a signal, such as the accumulated charge or the current and/or voltage produced in response to light incident upon the detector unit cells 160. In one embodiment, an SS-ADC 200 is provided that converts the current/voltage to a digital value. The SS-ADC 200 may be integral to the detection device 120, as shown in FIG. 1, integral to the ROIC 140, or may be a separate element within the image detector 100.

The ROIC 140 may include an image processing unit and may include a combination of hardware, software, or firmware that is operable to convert the received signal into an electronic image.

The ROIC 140 may include an array of ROIC unit-cells that are arranged in an X×Y matrix corresponding to the chiral orientation of the X×Y matrix of the detector unit cells 160. Thus, each ROIC unit-cell may be interconnected with a corresponding detector unit cell 160 by way of one or more direct bond interconnects, such as direct metal-to-metal interconnects or indium interconnects.

Figure 2:
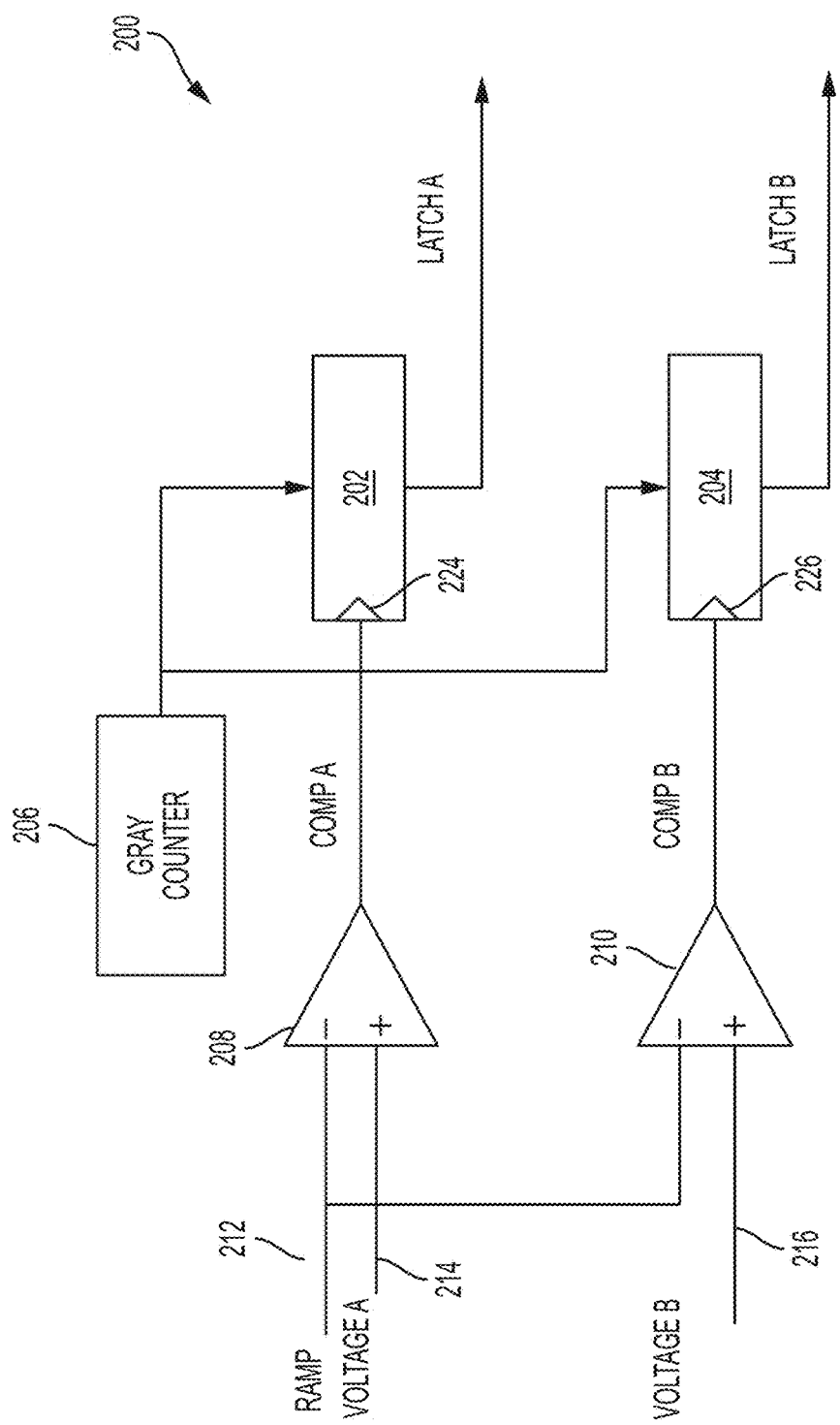
FIG. 2 is a schematic diagram illustrating an SS-ADC according to the prior art.

FIG. 2 illustrates an example SS-ADC 200 that may be used to read values from two different voltage sources, such as, for example, two different pixels or unit cells 160. In general, a ramp voltage is applied to a comparator and when the ramp voltage exceeds the voltage provided by the voltage source, the comparator changes state (in this case, from high to low) and this causes a counter value to be stored in a latch. The ramp voltage linearly increases with time. As such, there is a linear relationship between a counter or time value and the voltage that caused that value to be stored. In this manner, the voltage input to the comparator (as opposed to the ramp voltage) is converted from an analog value to a digital value. Although only two ADC's are shown, practical implementations implements thousands of SS-ADC's operating in parallel. The ramp (212) and counter (206) is common to all ADC's—while only the comparator (210) and latch (204) is replicated.

Figure 3:
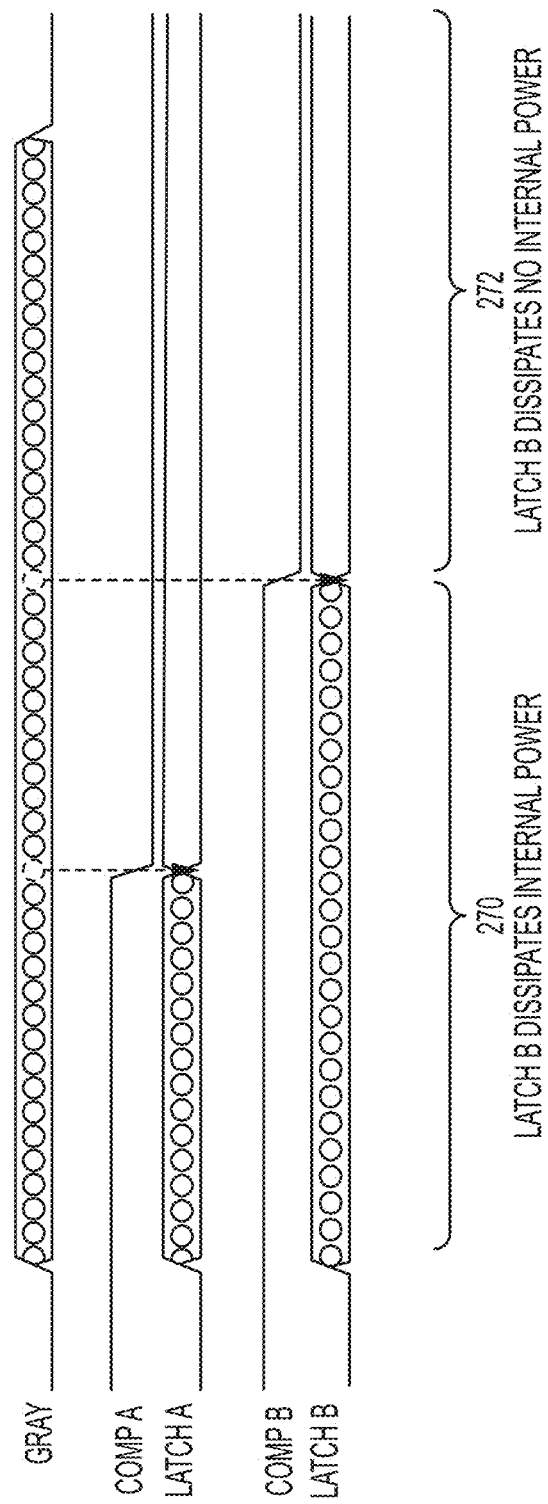
FIG. 3 shows a timing diagram during operation of the SS-ADC of FIG. 2.

In more detail and with reference to FIGS. 2 and 3, SS-ADC 200 includes to first and second storage latches 202, 204 that may also be referred to as latch A and latch B herein. These latches 202, 204 can be of any bit length. The latches 202, 204 both have an input that is coupled to an output of a counter 206 that, in one embodiment, is a gray code counter. Gray code is a binary numeral system where two successive values differ in only one bit (binary digit). Of course, the counter 206 could utilize other digital counting schemes. As will be understood, the counter 206 and the voltage ramp may share a common reset (not shown) to ensure that they are synchronized.

Each of the latches 202, 204 has a trigger input (224, 226, respectively) that, when it receives a particular signal, causes the value of the counter 206 to be stored therein. In the particular example shown herein, a first comparator (or comparator A) 208 is connected to the trigger input 224. When the output of the first comparator 208 goes low (e.g., the ramp voltage on input 212 exceeds the voltage (voltage A) on input 214 to the first comparator 208) the value of the counter 206 is stored in the first latch 202. Similarly, a second comparator (or comparator B) 210 is connected to the trigger input 226 of the second latch 204. When the output of the second comparator 210 goes low (e.g., the ramp voltage on input 212 exceeds the voltage (voltage B) on input 216 to the second comparator 210) the value of the counter 206 is stored in the first latch 202. In both cases, the stored value is held until the next reset and can be output as shown by outputs Latch A and Latch B, respectively. As noted above, the voltage A on input 214 to comparator 208 may be output from a first unit cell 160 and the voltage B on input 216 to comparator 210 may be output from a second unit cell 160.

In operation, each of the latches 202, 204 can either be storing a value, or passing the counter value through it. It has been discovered that when passing through values (e.g., when the latch is transparent) it dissipates more power than in a latch mode. This is illustrated in FIG. 3 where signal Latch B (e.g., the greycode value stored in the second latch 204) is "transparent" during the first time period 270 and latched in the second time period 272. It is the transition of the signal Comp B (output from comparator 210) from high to low that causes the transition from a transparent mode to a latched mode.

Figure 4:
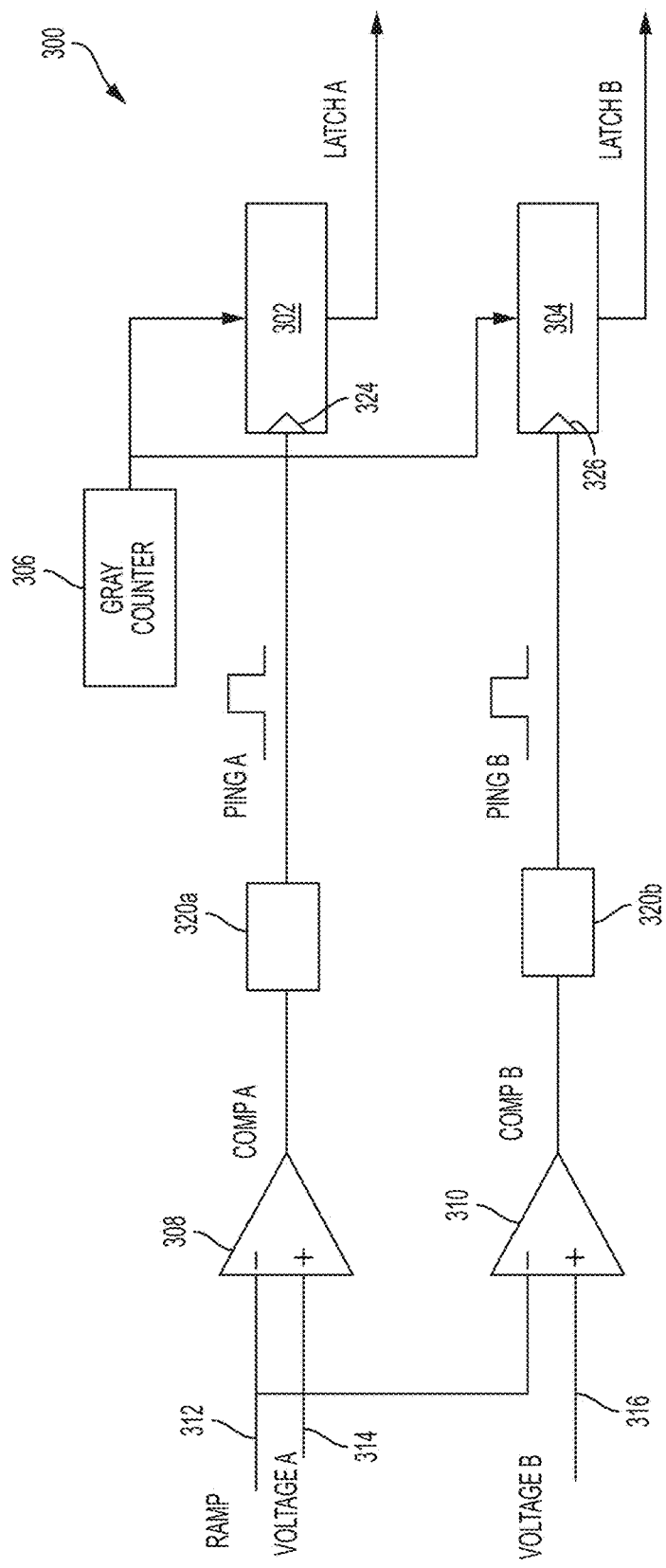
FIG. 4 is a schematic diagram illustrating an SS-ADC according to the one embodiment.
Figure 5:
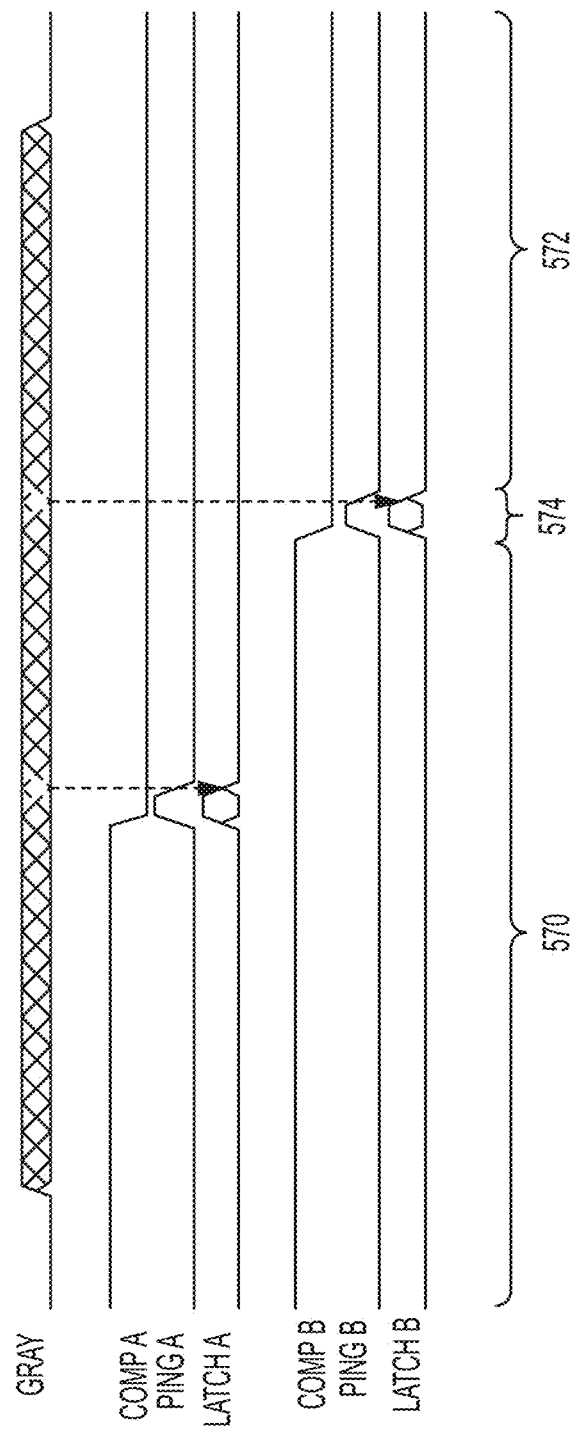
FIG. 5 shows a timing diagram during operation of the SS-ADC of FIG. 4.

In one embodiment, and with reference now to FIGS. 4 and 5, rather than maintain the latches (first and second latches 302, 304) in transparent mode when a value is not stored, provision of a small time duration pulse (e.g., 1 ns) is sufficient to store a new value in the latch. In particular, each latch 302, 304 is fed a pulse (shown as Ping A and Ping B). The falling edge of the pulse Ping A, Ping B causes the value of the counter 306 to be stored in a respective latch 302, 304. In this manner, each latch 302, 304 remains in the "latched" mode at all times (e.g., time periods 270, 272 of FIG. 3) when the pulse is not presented. In FIG. 5 that time period is shown as time period 574 and corresponds to the time that Ping B is high. It shall be understood that Ping A has the same effect on the first latch 302 as Ping B has on the second latch 304 but is not fully shown in FIG. 5 for reasons of drawing clarity. In this manner, power used by the SS-ADC 300 is less than SS-ADC 200 of FIG. 2. It shall be understood that while only two values are shown as being stored in the FIGS. (e.g., only 2 latches are shown) that this is not limiting and the teachings herein apply to any SS-ADC that can convert one or more values from analog to digital.

In more detail and with reference to FIGS. 4 and 5, the SS-ADC 300 includes first and second storage latches 302, 304 that may also be referred to as latch A and latch B herein. These latches 302, 304 can be of any bit length. The latches 302, 304 both have an input 324 and 326, respectively that is coupled to an output of a counter 306 that, in one embodiment, is a gray code counter. Gray code is a binary numeral system where two successive values differ in only one bit (binary digit). Of course, the counter 306 could utilize other digital counting schemes. As will be understood, the counter 306 and a voltage ramp applied to two comparators as described below may share a common reset (not shown) to ensure that they are synchronized.

Each of the latches 302, 304 has a trigger input (324, 326, respectively) that, when it receives a particular signal, causes the value of the counter 306 to be stored therein.

In the particular example shown herein, a first comparator (or comparator A) 308 is connected to the trigger input 324 of the first latch 302 via a pulse generator 320a. When the output of the first comparator 308 goes low (e.g., the ramp voltage on input 312 exceeds the voltage (voltage A) on input 314 to the first comparator 308) the pulse generator 320a generates a pulse (Ping A). The pulse is provided to the trigger input 324 to cause the value of the counter 306 to be stored in the first latch 302. Similarly, a second comparator (or comparator B) 310 is connected to the trigger input 326 of the second latch 304 via a pulse generator 320b. When the output of the second comparator 310 goes low (e.g., the ramp voltage on input 312 exceeds the voltage (voltage B) on input 316 to the second comparator 310) the second pulse generator 320b generates Ping B and the value of the counter 306 is stored in the second latch 304. In both cases, the stored value is held until the next reset and can be output as shown by outputs Latch A and Latch B, respectively. As noted above, the voltage A on input 314 to comparator 308 may be output from a first unit cell 160 and the voltage B on input 316 to comparator 310 may be output from a second unit cell 160. The first and second comparators 308, 310 both include positive and negative inputs as indicated by the (+) and (−) signs shown on them in FIG. 4.

In operation, each of the latches 302, 304 can either be storing a value, or passing the counter value through it. It has been discovered that when passing through values (e.g., when the latch transparent) it dissipates more power than in a latch mode.

In the embodiment shown in FIG. 4 (and with reference to FIG. 5 as well) the latches 302, 304 only receive a high pulse (Ping A or B) for a short time. Thus, in both time frames 570 and 572 (when Ping A and Ping B are both low) the latches 302, 304 are in the latched mode. As compared to the embodiment of FIG. 2, being in the latched mode for a greater amount of time, the embodiment of FIG. 4 will use less power. That is, the second latch 304 is only in the pass through mode during time period 574 (e.g., when Ping B is high). While not separately described, it is understood that similar operation occurs with the first latch 302 (e.g., it is only latched when Ping A is high).

Figure 6:
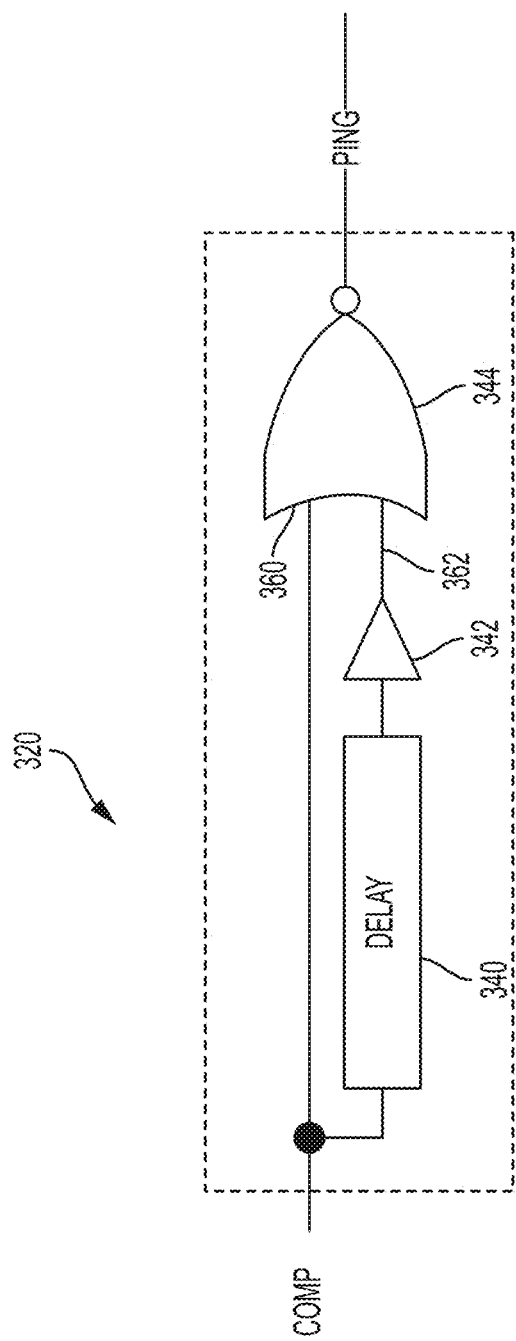
FIG. 6 shown an example of pulse generator that may be used in the SS-ADC disclosed herein.

FIG. 6 shows a schematic of one of the example of a pulse generator 320. The pulse generator 320 receives, as an input from a comparator, the comparison signal, Comp, and produces an output pulse shown as Ping. Comp and Ping are the same as shown above in FIG. 5 for each individual channel (e.g., Comp A and Ping A, etc.).

The pulse generator 320 includes a NOR gate 344 that has two inputs. One of the inputs (input 360) is connected (in this case directly) to the input Comp. The other (input 362) is connected to a delayed and inverted version of Comp. This can be accomplished by connected a delay element 340 in series with an inverter 342 between the input comp and input 362 of the NOR gate 344. The amount of delay can be selected by forming a delay element 340. A delay element is typically a sequence of logical inverters which may be designed to have an intentional long propagation delay. Some standard cell libraries provided by semiconductor foundries include specific delay buffers that will provide an output transition 1 ns, 2 ns or 3 ns after the input transition. The delay may also be slightly affected delay through the inverter 342 but this can be ignored in some instances.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A single slope analog to digital converter (ADC) comprising:
   a comparator having a positive input and a negative input and a comparator output;
   a counter;
   a latch connected to an output of the counter and that includes a trigger input; and
   a pulse generator coupled to the comparator output that produces a pulse of a defined width each time a signal on the negative input transitions from a voltage level that is below a voltage level on the positive input to a voltage level that is above the voltage level on the positive input;
   wherein the pulse generator includes a pulse generator output coupled to the trigger input and wherein the pulse generator includes a gate having first and second logic gate inputs, the first logic gate input being coupled to the comparator output and the second logic gate input being coupled to a delayed version of the comparator output.

2. The single slope ADC of claim 1, wherein the delayed version of the comparator output is inverted.

3. The single slope ADC of claim 2, wherein the pulse generator has a first pulse generator input and further comprises:
   a delay element; and
   an inverter connected in series with the delay element;
   wherein the inverter and the delay element are connected between the first pulse generator input and the second logic gate input.

4. The single slope ADC of claim 1, wherein the counter is a gray counter.

5. The single slope ADC of claim 1, wherein the comparator comprises:
   a first comparator having first positive and negative inputs and a first comparator output;
   a second comparator having second positive and negative inputs and a second comparator output;
   wherein the second negative input is connected to the first negative input.

6. A single slope analog to digital converter (ADC) comprising:
   a first comparator having a positive input and a negative input and a first comparator output;
   a first counter;
   a first latch connected to an output of the first counter and that includes a first trigger input; and
   a first pulse generator coupled to the first comparator output that produces a pulse of a defined width each time a signal on the negative input of the first comparator transitions from a voltage level that is below a voltage level on the positive input of the first comparator to a voltage level that is above the voltage level on the positive input of the first comparator;

a second comparator having a positive and a negative input and a second comparator output;
a second counter;
a second latch connected to an output of the second counter and that includes a second trigger input; and
a second pulse generator coupled to the second comparator output that produces a pulse of a defined width each time a signal on the negative input of the second comparator transitions from a voltage level that is below a voltage level on the positive input of the second comparator to a voltage level that is above the voltage level on the positive input of the second comparator.

7. The ADC of claim 6, wherein the first pulse generator includes a first pulse generator output coupled to the trigger input of the first latch and wherein the first pulse generator includes a gate having first and second logic gate inputs, the first logic gate input being coupled to the first comparator output and the second logic gate input being coupled to a delayed version of the first comparator output.

8. The single slope ADC of claim 7, wherein the delayed version of the comparator output is inverted.

9. The single slope ADC of claim 8, wherein the first pulse generator includes a first pulse generator input and further comprises:
a delay element; and
an inverter connected in series with the delay element;
wherein the inverter and the delay element are connected between the first pulse generator input and the second logic gate input.

10. The single slope ADC of claim 6, wherein the counter is a gray counter.

11. The single slope ADC of claim 6, wherein the negative input of the second comparator is connected to the negative input of the first comparator.

12. An image detector comprising:
an array of detector unit cells including a first unit cell that includes a first unit cell output; and
a single slope analog to digital converter (ADC) coupled to the output first unit cell output, the ADC comprising:
a comparator having a positive input connected to the first unit cell output, a negative input and a comparator output;
a counter;
a latch connected to an output of the counter and that includes a trigger input; and
a pulse generator coupled to the comparator output that produces a pulse of a defined width each time a signal on the negative input transitions from a voltage level that is below a voltage level on the positive input to a voltage level that is above the voltage level on the positive input;
wherein the pulse generator includes a pulse generator output coupled to the trigger input and wherein the pulse generator includes a gate having first and second logic gate inputs, the first logic gate input being coupled to the comparator output and the second logic gate input being coupled to a delayed version of the comparator output.

13. The image detector of claim 12, wherein the delayed version of the comparator output is inverted.

14. The image detector of claim 12, wherein the pulse generator has a first pulse generator input and further comprises:
a delay element; and
an inverter connected in series with the delay element;
wherein the inverter and the delay element are connected between the first pulse generator input and the second logic gate input.

15. The image detector of claim 12, wherein the counter is a gray counter.

16. The image detector of claim 12, wherein the comparator comprises:
a first comparator having first positive and negative inputs and a first comparator output;
a second comparator having second positive and negative inputs and a second comparator output;
wherein the second negative input is connected to the first negative input.

* * * * *